United States Patent [19]

Towe et al.

[11] Patent Number: 4,827,482

[45] Date of Patent: May 2, 1989

[54] PHASE-LOCKED SEMICONDUCTOR LASER ARRAYS

[75] Inventors: Elias Towe, Cambridge; Clifton G. Fonstad, Jr., Arlington, both of Mass.

[73] Assignee: Massachusetts Institute of Technology, Cambridge, Mass.

[21] Appl. No.: 178,895

[22] Filed: Mar. 21, 1988

Related U.S. Application Data

[63] Continuation of Ser. No. 127, 792 filed Dec. 1, 1987.

[51] Int. Cl.[4] ............................................... H01S 3/19
[52] U.S. Cl. ........................................ 372/44; 372/50; 372/45
[58] Field of Search ............................. 372/44, 45, 50

[56] References Cited

U.S. PATENT DOCUMENTS

| | | | |
|---|---|---|---|
| 4,255,717 | 3/1981 | Scifres et al. | 372/50 |
| 4,594,719 | 6/1986 | Ackley | 372/50 |
| 4,641,311 | 2/1987 | Ackley | 372/1 |
| 4,692,925 | 9/1987 | Botez | 372/50 |

OTHER PUBLICATIONS

"Diffraction Coupled Phase-Locked Semiconductor Laser Array", J. Katz, Appl. Phys. Lett., vol. 42, No. 7, 4/1/83.
"Analysis of a Y-junction Semiconductor Laser Array", W. Steifer, Appl. Phys. Lett. 49(2), 7/14/86.
"Phase-Locked Controlled Filament Laser", Salzman et al., Appl. Phys. Lett. 49(11), 9/15/86.
"Phase-Locked Semiconductor Quantum Well Laser Arrays", Elias Towe, Massachusetts Institute of Technology, (Unpublished Thesis).
"A Novel Diffraction-Coupled Phase-Locked Array", Towe et al., 2/17/87.
"Mixed-Mode Phase-Locked Quantum Well Laser Arrays", Towe et al., IEDM 86, 12/7/86.
"In-Phase Locking In Diffraction-Coupled Phase-d-Array Diode Lasers", S. Wang, Appl. Phys. Lett. 48(26), 6/30/86.

Primary Examiner—Leon Scott, Jr.
Attorney, Agent, or Firm—Hamilton, Brook, Smith & Reynolds

[57] ABSTRACT

A method and apparatus for phase-locking semiconductor laser arrays is described wherein individual light waves propagating in adjacent waveguides are phase-locked by intercoupling the waveguides in a specific manner. The waveguides are intercoupled in an unguided mode-mixing region wherein various modes of propagation mix by diffraction. The length of this region is fixed at a distance z which produces a phase difference an integral multiple of $2\pi$ between adjacent waveguides.

21 Claims, 5 Drawing Sheets

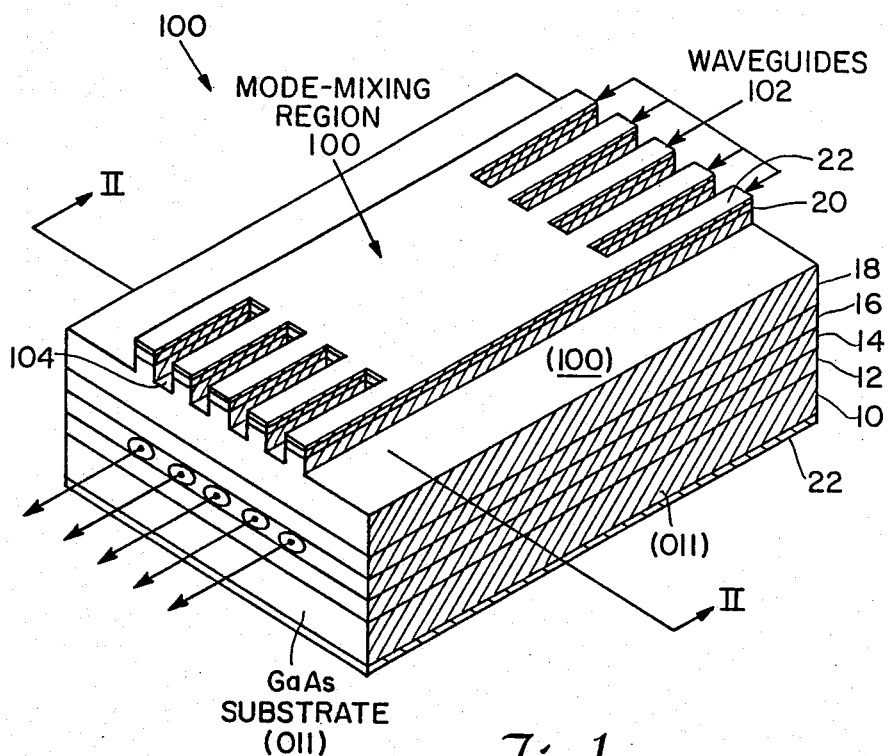
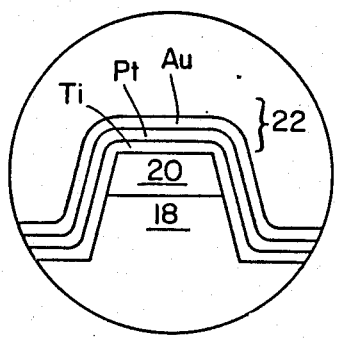
Fig. 2A
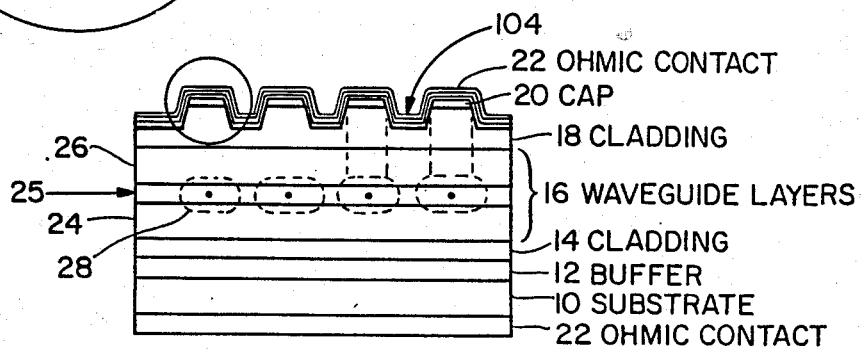
Fig. 2

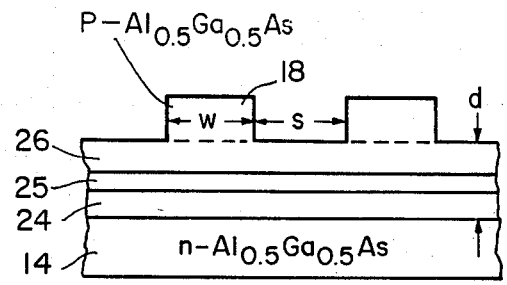
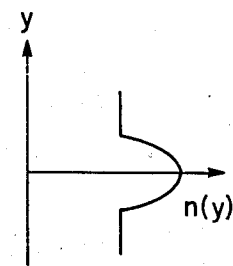
Fig. 4a      Fig. 4b
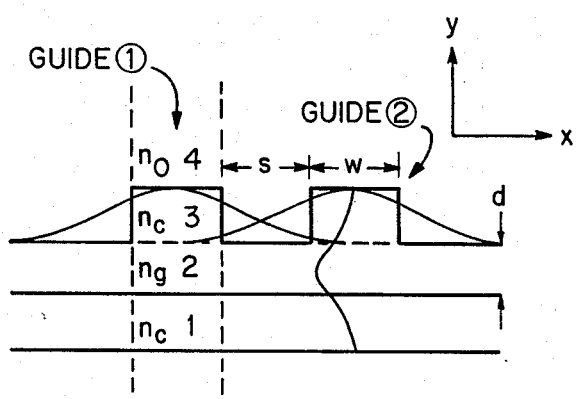
Fig. 4c

PHASE-LOCKED SEMICONDUCTOR LASER ARRAYS

The Government has rights in this invention pursuant to Grant Number ECE-8305448 and DAAL03-86-K-0002 awarded by the National Science Foundation and the Department of the Army.

This is a continuation of co-pending application Ser. No. 127,792 filed on Dec. 1, 1987.

BACKGROUND ART

This invention relates to lasers and, more particularly, to a method and apparatus for phase-locking a plurality of optical waves propagating in a monolithic laser array to cause them to operate as a single coherent source.

During the late 1970's, there evolved a need for III–V semiconductor lasers capable of emitting light powers in the range of 20 to 70 mW. The first generation of these high power devices were the so-called large optical cavity (LOC) lasers. For the most part, they were operated in a pulsed mode. These devices, though capable of meeting the needs of the time, were still limited in how much ultimate power they could deliver. This is because the highest optical power any semiconductor laser can deliver is limited by its ability to withstand the catastrophic mirror damage.

Another class of high power lasers were the facet coated lasers. The outputs of ordinary laser diodes were increased by appropriately coating one facet of the device with anti-reflection coatings. The improvements gained by this method are not very significant in view of the difficulties involved in the deposition of these coatings.

Research then focussed on discrete arrays. In these devices, a series of individual diode lasers are disposed side-by-side and electrically connected in series. The devices are separated from one another by a few millimeters. Optical peak powers in excess of 4 W were achieved from the discrete arrays of this kind, thus satisfying the need for high power. They did not, however, meet the requirement for narrow, collimated beams. Beam forming optics still had to be used to collimate the optical outputs of these devices. This meant that the range of applicability was limited.

The principles of the solution of the problem of obtaining beams with narrow spatial extent in semiconductor lasers are intimately linked to the physics of diffraction in narrow apertures.

The overall size of the ordinary semiconductor laser dictates the spatial extent of the beam emanating from it. In order to circumvent this physical restriction, methods had to be found to increase the lateral effective aperture from which most of the radiation is emitted. It was with this motivation that linear monolithic arrays were developed. If the individual array elements can be phase-locked, narrower beams can be achieved. This follows directly from the physics of diffraction. The first evanescently-coupled linear arrays were studied by Ripper and Paoli circa 1970. These early studies established mutual interaction amongst the elements of the array. The possibilities of phase-locking and beam-steering monolithic laser arrays were shown by Scifres et al. in U.S. Pat. No. 4,255,717 issued Mar. 10, 1981. For the majority of the evanescently-coupled devices reported, operation in a narrow, single-lobe has been more of an exception than the rule. [See D. Botez and D. Ackley, *IEEE Circuits and Devices Magazine*, 2, 8 (1986)]. This is mainly because there is a lack of control of the phase relationship required for collective coherence of the array elements. The implementation of a deliberate control mechanism for this phase relationship is therefore crucial for the operation of the devices as a single coherent source.

DISCLOSURE OF THE INVENTION

This invention, in general, comprises a method and apparatus for phase-locking individual light waves propagating in adjacent waveguides by intercoupling the waveguides to provide an unguided mode-mixing region wherein the various modes of propagation of the light waves are allowed to mix by diffraction. More specifically, to achieve collective coherence of the waves and, hence, phase-locking, the length of the mode-mixing region is critical. This length must be such that it produces a phase difference, which is an integral multiple of $2\pi$ wavelengths, between a wave propagating in a particular waveguide and waves propagating in immediately adjacent waveguides and coupled to it in the unguided mode-mixing region.

BRIEF DESCRIPTION OF THE DRAWINGS

FIG. 1 is a perspective schematic diagram of a preferred embodiment of the invention.

FIG. 2 is a cross-sectional view along the lines II—II of FIG. 1.

FIG. 2A is an enlarged view of a portion of the section of FIG. 2.

FIG. 4a is a schematic illustration of the coupled waveguide laser structure for the lateral guides.

FIG. 4b is a plot of n(y) the index of refraction n(y) in the y direction.

FIG. 4c is a schematic illustration of the coupled waveguide laser structure for the transverse guide.

BEST MODE OF CARRYING OUT THE INVENTION

Figures 3A, 3B, 3C, 3D:
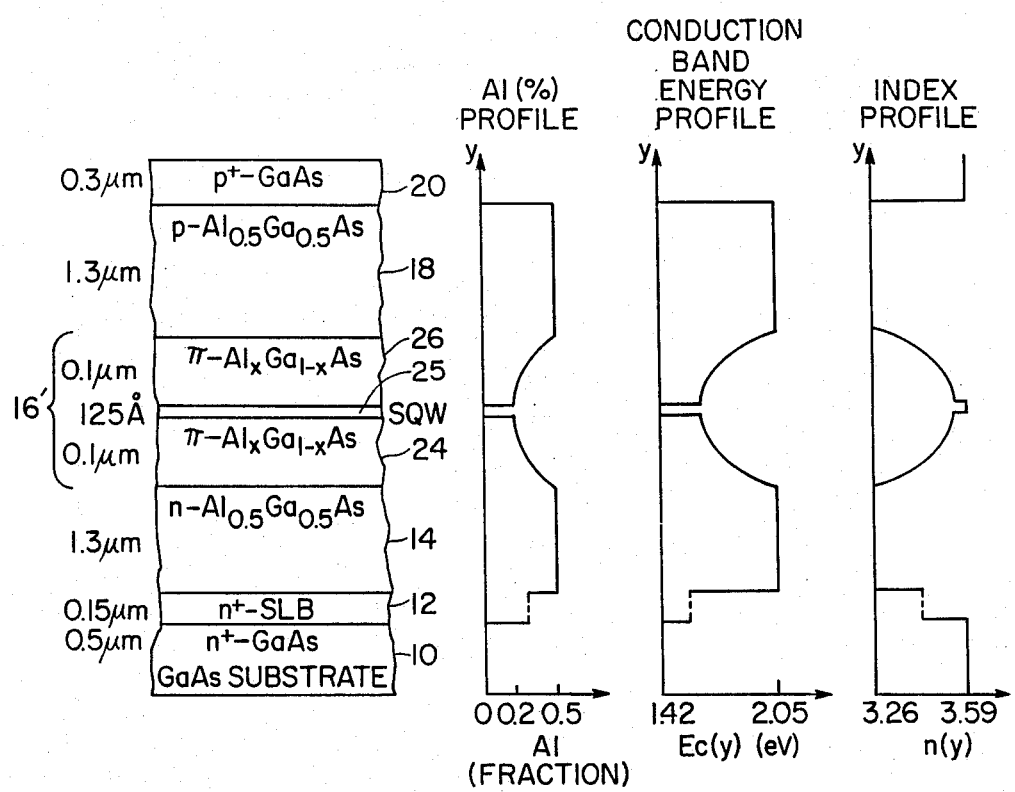
FIG. 3a is an enlarged view of a cross-section of the device of FIG. 1 with the metallization omitted.
FIG. 3b is a plot of the Al percentage in the y-direction through the device of FIG. 1 versus the y position.
FIG. 3c is a plot of the conduction band energy profile in the y-direction versus Ec(y) in electron volts.
FIG. 3d is a plot of the index of refraction profile in the y direction versus n(y) wherein n(y) is the index of refraction profile in the y-direction.

Referring to FIGS. 1–3, there is shown in schematic form a multiple quantum well heterostructure laser embodiment of the invention. The device 10, may be fabricated by liquid phase epitaxy, molecular beam epitaxy or metal organic processes, which techniques are known in the art.

Successive layers of semiconductor material are deposited on an n+-GaAs substrate 10. Layers 12, 14, 16, 18 and 20 may comprise, respectively, a superlattice buffer layer of alternately deposited layers of n+GaAs-/Al Ga$_{0.5}$Ga$_{0.5}$As, cladding layer 14 of n-Al$_{0.5}$Ga$_{0.5}$As, waveguide layers 16, cladding layer 18 of p-Al$_{0.5}$Ga$_{0.5}$As, and a cap layer 20 of p+-GaAs.

As shown in FIG. 3a, the waveguide layers are comprised of three successively grown layers 24, 25 and 26, forming a heterostructure. Layers 24 and 26 are formed of graded (Al,Ga)As having parabolically graded energy slopes (FIG. 3b) down which electronically injected carriers slide before tumbling into multiple quantum wells formed in the smaller band gap GaAs layer 25 sandwiched between the larger band gap layers 24 and 26. [See R. F. Kazarinow and G. V. Tsarenkov, *Soviet Physics*, Semiconductors, 10(2), 178(1976).] It should be noted that the multiple quantum well (MQW) structure shown differs from a superlattice structure in the relative magnitude of the barrier layer thickness $L_b$ and its relationship to the wave function penetration depth $L_p$ into the barrier. In MQW's, $L_b$ is made much greater than $L_p$, so that the wave functions of adjacent wells do not overlap. Superlattices are, in principle, a set of infinite periodic layers in which the barrier thickness $L_b$ is much less than the wave function penetration depth $L_p$; thus, the wave function of adjacent wells interact and the confined particles are delocalized. The physical properties of superlattice structures therefore depend on the super-periodicity superimposed on top of the lattice periodicity.

A desirable feature of quantum wells and the graded band gap (See FIGS. 3c and 3d) confining layers surrounding them is the formation of a barrier that prevents carrier motion out of the active region once they have been injected into that region. A good fraction of the carriers, thus tightly confined, recombine radiatively in the active volume leading to lower threshold current densities than in conventional double heterostructure lasers.

The parabolic index variation in the direction perpendicular to the p-n junction forms a transverse optical waveguide which confines the optical mode very close to the active volume. This particular form of the waveguide structure is preferable because when the transverse wave equation is solved with the parabolic index profile in it, the allowed solutions are Hermite Gaussian functions with the fundamental solution having a minimum full width at half maximum intensity. If the thickness of the confining layer is judiciously chosen, only the fundamental Gaussian mode will be excited.

All these features taken together, contribute toward minimizing the threshold current density and maximizing the differential external quantum efficiency.

It is noted that the cladding layers adjacent to the waveguide layers are composed of 50% Al. This composition of the ternary compound has a wider band gap than the cladding layers traditionally used in double heterostructure lasers. The purpose is twofold. First, by having these Al$_{0.5}$Ga$_{0.5}$As layers, which have indirect optical transitions, the probability of radiative recombination outside the waveguide region is decreased. Secondly, the high band gap material has a correspondingly low index of refraction. This has implications for the waveguiding properties of the graded index region. It means that the optical mode is tightly confined to propagate in the graded region only. The wide band gap material has another useful property which is not germane to the issues discussed here. This property is utilized in the formation of the Schottky barrier scheme used in confining the current to the longitudinal guides. The effect of carrier confinement in quantum well heterostructures and the attendant energy quantization that goes with it enables fabrication of lasers with very low threshold current densities (200 A/cm$^2$) and narrow gain spectra.

The structure, as thus far described, comprises an array of closely adjacent quantum well semiconductor lasers, each of which is designed to operate confined in both the lateral and transverse fundamental mode. Each laser by itself generates coherent radiation. However, because of inhomogeneities in the lasing medium and irregularities in the photon generation process across the entire medium, it is unlikely that such an array of elements will always be collectively coherent. Therefore, some means of forcing collective coherence has to be implemented, so that all the elements of the array have the same relative phase.

The present method of inducing collective coherence involves phase-locking adjacent elements by coupling a fraction of the radiation propagating in one guide to another adjacent to it and vice versa. This is done across the entire array of elements. When the conditions are right, the individual elements will all operate with the same phase. The method of evanescent wave coupling is the simplest technique of phase-locking adjacent laser elements. This technique depends critically on the ability to delineate waveguides on the laser structure. Therefore, wave guidance is important in the array elements.

In the present structure, both lateral and transverse mode confinement is present. The transverse electromagnetic mode confinement is automatically built into the laser structure by the several hetero-epitaxial layers that constitute a waveguide in that direction. FIG. 4a shows a simple model of the laser array to illustrate the waveguidance principles. In this figure, only the epitaxial layers that are necessary for the guidance of an optical mode in the structure are retained. The structure in FIG. 4a shows the n-type Al$_x$Ga$_{1-x}$As and the top p-type Al$_x$Ga$_{1-x}$As cladding layers 14 and 18, respectively; wherein x=0.5. Sandwiched between them is a single quantum well active layer 25 surrounded by a parabolically graded Al$_x$Ga$_{1-x}$As waveguide, comprising layers 24 and 26. FIG. 4b is a plot of index of refraction versus y-axis showing the parabolic index grading. FIG. 4C shows two of the ridge waveguides labelled guide 1 and guide 2 necessary for lateral confinement of the modes. The ridges of index $n_c$ are surrounded by a medium of index $n_o$ (in this case air). For this analysis, assume (temporarily) that the waveguides are passive. The guided modes of such a structure are essentially of the TE or TM kind $E_{mn}^x$ and $E_{mn}^y$, where m and n are the mode label indices.

Figure 5:
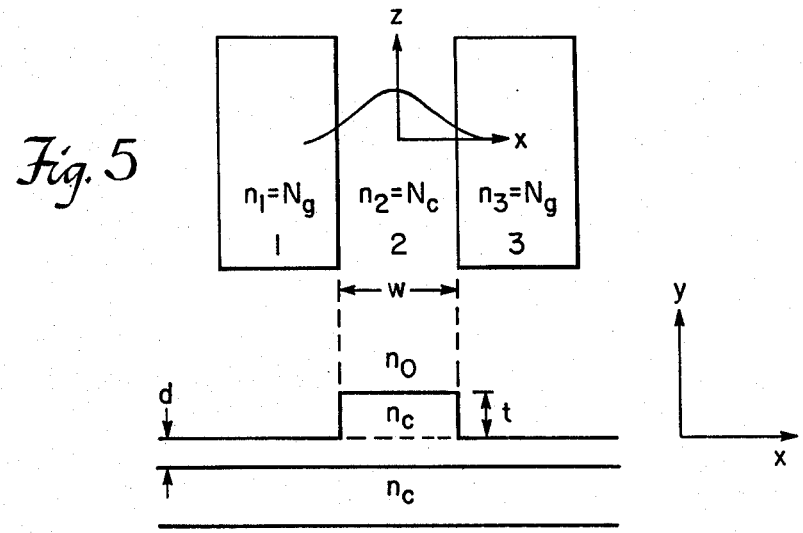
FIG. 5 is an illustration of the equivalent waveguide structure abstracted from FIGS. 4a–c.

Before proceeding with the analysis, another model is extracted from FIG. 4b. This new model of the ridge waveguide is shown in FIG. 5. Consider the lower structure shown in FIG. 5 and the upper suggested equivalent structure viewed from the top. This upper structure is symmetric about the x-axis and can be thought of as an equivalent guide that provides confinement in the x-direction. The effect of the extra ridge thickness t, is to create a region of effective index $N_c$, higher than that of the outer regions, $N_g$.

The indices of refraction of the original ridge waveguide structure are $n_c$, $n_g$ and $n_o$ (See FIG. 4c). In this case $n_g > n_c$ and $n_g > n_o$. The equivalent planar guide 13 is shown in the top illustration of FIG. 5b. This guide has effective indices of refraction defined by $N = \beta/k$ through a transcendental dispersion relation.

In FIG. 5b, the effective indices of refraction $N_c$ and $N_g$ are redefined for convenience in regions 1, 2 and 3 of the equivalent guide, as follows:

$$n_1 = N_g = n_3 \quad (1)$$

$$n_2 = N_c. \quad (2)$$

Notice that $n_1 = n_3$ for this particular structure because of the symmetry inherent in the ridge waveguide about the x-axis.

For an assumed $E_y$ field distribution of the form:

$$E_y(x,z,t) = \epsilon_y(x) e^{j(\omega t - \beta z)} \quad (3)$$

we find from Maxwell's equations that:

$$H_x(x, z, t) = \frac{-\beta}{\omega \mu_o} \epsilon_y(x) e^{j(\omega t - \beta z)} \quad (4)$$

$$H_z(x, z, t) = \frac{j}{\omega \mu_o} \frac{\partial E_y}{\partial x} \quad (5)$$

The lateral field distribution, $\epsilon_y(x)$, can be assumed to be of the form:

$$\epsilon_y(x) = A e^{q(x + w/2)} \quad (6)$$
$$x \leq w/2$$

$$\epsilon_y(x) = B e^{jhx} + C e^{-jhx} \quad (7)$$
$$|x| \leq w/2$$

$$\epsilon_y(x) = D e^{-p(z - w/2)} \quad (8)$$
$$x \geq w/2$$

where A, B, C and D are constants to be determined by imposing continuity conditions on the tangential electric and magnetic fields at the guide interfaces. The constants q, h and p are the lateral propagation constants in the different regions of the waveguide.

Application of the continuity conditions to Equations 6, 7, 8 and to a similar set derived from Equation 5, leads to a system of linear equations whose determinantal equation, when set to zero, immediately yields the eigenvalue equation:

$$hw = \tan^{-1}\left(\frac{p}{h}\right) + \tan^{-1}\left(\frac{q}{h}\right) + m\pi, \quad m = 0, 1, 2, \ldots \quad (9)$$

where m is the lateral mode number. Substitution of the field quantities in Equations 6, 7 and 8 into the wave equation results in the additional relationships:

$$\begin{aligned} q &= \sqrt{\beta^2 - (n_1 k_0)^2} \\ h &= \sqrt{(n_2 k_0)^2 - \beta^2} \\ p &= \sqrt{\beta^2 - (n_3 k_0)^2} \\ k_0 &= 2\pi/\lambda_0 \end{aligned} \quad (10)$$

where $\lambda_o$ is the free-space wavelength of propagation.

Before proceeding further, we introduce normalizations that combine several guide parameters. Let us define a normalized width W by:

$$W = k_0 w \sqrt{n_2^2 - n_1^2}. \quad (11)$$

Also, let us define the normalized guide index b related to the effective index N (and) by:

$$b = \frac{N^2 - n_1^2}{n_2^2 - n_1^2} \quad (12)$$

This normalized index takes on values between zero and unity. Using the expressions of Equation 10 and the normalizations of Equations 11 and 12, we can rewrite the eigenvalue equation 9 in the form:

$$W\sqrt{1-b} = \tan^{-1}\sqrt{\frac{b}{1-b}} + \tan^{-1}\sqrt{\frac{b}{1-b}} + m\pi. \quad (13)$$

Figure 6:
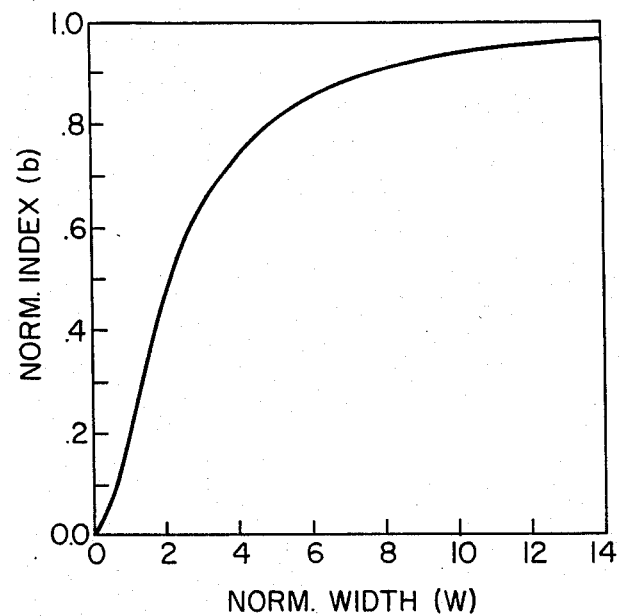
FIG. 6 is a plot of the dispersion curve, i.e., normalized index ($\rho$) versus normalized width (w), of a ridge waveguide laser.

This Equation 13 can be solved graphically and the graph used to determine the guide width, w, from the effective indices $N_g$ and $N_c$. FIG. 6 shows the graphical solution of Equation 13 for the $m = 0$ mode or the fundamental mode.

Using Maxwell's equations and matching the tangential field components at the interfaces of the transverse guide shown in FIG. 4c, the transcendental eigenvalue equation governing the propagation characteristics in the transverse direction can be obtained. This equation is similar in form to Equation 9. It is:

$$k_2 d = \tan^{-1}\left(\frac{\gamma_1}{k_2}\right) + \tan^{-1}\left(\frac{\gamma_3}{k_2} \frac{1 - \eta e^{-\gamma_s t}}{1 + \eta e^{-\gamma_s t}}\right) + m\pi, \quad m = 0, 1, 2, \ldots \quad (14)$$

where $\eta$ is defined as:

$$\eta = \frac{\gamma_3 - \gamma_4}{\gamma_3 + \gamma_4}. \quad (15)$$

The transverse propagation constants in each layer are given by:

$$\begin{aligned} \gamma_4 &= \sqrt{\beta^2 - (k_o n_o)^2} \\ \gamma_3 &= \sqrt{\beta^2 - (k_o n_c)^2} \\ k_2 &= \sqrt{(k_o n_g)^2 - \beta^2} \\ \gamma_1 &= \sqrt{\beta^2 - (k_o n_c)^2} \end{aligned} \quad (16)$$

where $k_o = 2\pi/\lambda_o$ as before. Normalizations are defined as before. Let the normalized thickness of the guide be:

$$D = k_o d \sqrt{n_g^2 - n_c^2} \quad (17)$$

and the normalized guide index $\rho$ be given by:

$$\rho = \frac{N^2 - n_c^2}{n_g^2 - n_c^2} \tag{18}$$

The effective index is still defined through:

$$N = \beta/k \tag{19}$$

Using these normalizations and the expressions of Equations 15 and 16, we can recast the eigenvalue Equation 14 in the form:

$$D\sqrt{1-\rho} = \tan^{-1}\sqrt{\frac{\rho}{1-\rho}} + \tag{20}$$

$$\tan^{-1}\left(\sqrt{\frac{\rho}{1-\rho}} \; \frac{1 - \eta e^{-2k_o\sqrt{\rho\sigma}\,t}}{1 - \eta e^{-2k_o\sqrt{\rho\sigma}\,t}}\right) + m\pi$$

where $\eta$ is defined as:

$$\eta = \frac{\sqrt{\rho\sigma} - \sqrt{\rho + \frac{\alpha}{\sigma}}}{\sqrt{\rho\sigma} + \sqrt{\rho + \frac{\alpha}{\sigma}}} \tag{21}$$

and $\alpha$ and $\sigma$ are constants defined by:

$$\alpha = n_c^2 - n_o^2 \tag{22}$$

$$\sigma = n_g^2 - n_c^2$$

Figure 7:
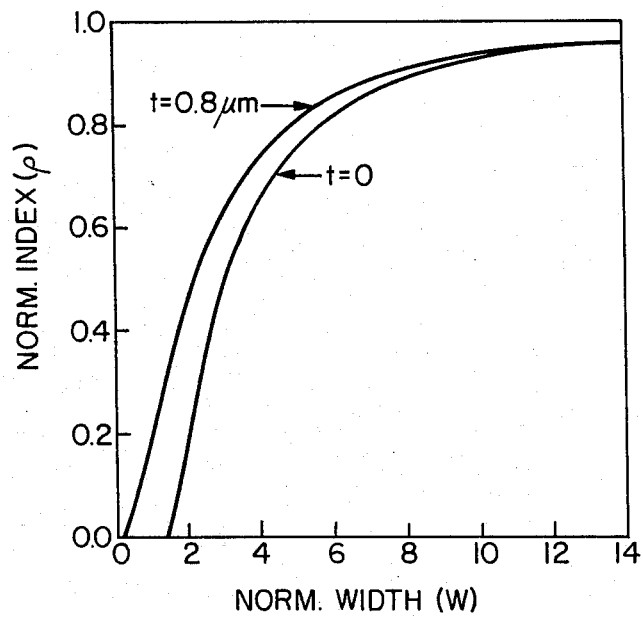
FIG. 7 is a plot of the dispersion curve, i.e., normalized index ($\rho$) versus normalized width (w), of the transverse guide of a ridge waveguide laser.

The normalized index of Equation 18 ranges between zero and unity. As before, Equation 20 can be solved graphically. The ridge thickness, t, appears as a parameter that can be set to any desired value. As expected, this thickness controls the effective index, $N_c$. The effective index $N_g$, in regions 1 and 3 in FIG. 5c is obtained by setting t=0. FIG. 7 shows the graphical solution of Equation 20 for the fundamental transverse mode for two different ridge thicknesses.

The above analysis and the resulting curves of FIGS. 6 and 7 can be used in the determination of the appropriate waveguide dimensions for device fabrication of typical ridge waveguides. Assume that only the fundamental (m=0) transverse and lateral modes are allowed in the guide and that the wavelength of oscillation is $\lambda_o \approx 0.86$ $\mu$m. Let the active region be a layer of GaAs, 250 Å thick surrounded by an optical waveguide of $Al_{0.18}Ga_{0.82}As$, whose thickness is 4400 Å. The total composite guide thickness, d, is 4650 Å. For an AlAs mole fraction of 0.18 in the waveguide, $n_g \approx 3.469$ for $|y| \leq d$, assume that the cladding layers have an AlAs mole fraction of 0.35; then $n_c \approx 3.353$. This cladding layer is etched down to form a ridge waveguide whose height is t=0.8 $\mu$m. From these values, the transverse normalized guide thickness is:

$$D = \frac{2\pi}{\lambda_o} d\sqrt{n_g^2 - n_c^2} \approx 3.05. \tag{23}$$

With this value of D, the corresponding normalized index, $\rho$, is determined from FIG. 7 (using the curve with t=0.8 $\mu$m), and this is $\rho=0.65$. Through use of Equation 18, the effective index value of $N_c=3.429$. By using the curve for t=0, the effective index value of $N_g=3.411$.

The effective index values of $N_c$ and $N_g$ can then be used as if they were the ordinary indices used in Equations 11 and 12 in order to help determine the guide width, $\omega$ in the lateral direction. Any combination of normalized width W and normalized index b that lies on the graph in FIG. 6 will give parameters for the fundamental lateral mode. For any one free parameter choosen (as long as its value is on the curve), the other parameters can be chosen by using Equations 11, 12 and FIG. 6.

By fabricating the laser array elements sufficiently close to one another, the evanescent wave propagating in the interguide space can overlap with a guided wave in another guide. After several round-trips in the cavity, the individual guides modes will eventually acquire a common phase because of the cross-coupling over the entire array.

The fraction of field energy coupled evanescently into a guide depends on several guide parameters. The field expressions of Equations 6, 7 and 8 can be rewritten in term of arbitrary amplitude, A, so that:

$$\epsilon_y(x) = Ae^{(qx+\omega/2)} \tag{24}$$
$$x \leq -\omega/2$$

$$\epsilon_y(x) = A\left[\frac{p}{h}\sin(hx) + \cos(hx)\right] \tag{25}$$
$$|x| \leq \omega/2$$

$$\epsilon_y(x) = A\left[\frac{p}{h}\sin\left(\frac{h\omega}{2}\right) + \cos\left(\frac{h\omega}{2}\right)\right]e^{-p(x-\omega/2)} \tag{26}$$
$$x \geq \omega/2$$

The constant A is chosen in such a way that the field $\epsilon_y(x)$ in the previous equations corresponds to a power flow of one unit (per unit width in the y-direction) in a mode. This normalization condition can be expressed as:

$$-\frac{1}{2}\int_{-\infty}^{\infty} E_y H_x^* = \frac{\beta_m}{2\omega\mu_o}\int_{-\infty}^{\infty}[E_y^m(x)]^2 dx = 1 \tag{27}$$

where m denotes the m-th confined lateral mode. Substitution of Equations 24 through 26 into 27 results in:

$$A = 2h_m\left[\frac{\omega\mu_o}{\beta_m\left(\omega + \frac{2}{p_m}\right)(h_m^2 + p_m^2)}\right]^{\frac{1}{2}} \tag{28}$$

The coupling coefficient from one guide to another is normally defined through the electric polarization perturbation. It can be shown that this coefficient, $k_{n+1,n}$ is given by:

$$K_{12} = K_{21} = \frac{\partial^2}{2\omega\partial t^2}\int_{-\infty}^{\infty} P_{pert}(x,t)\epsilon_y(x)dx \tag{29}$$

wherein: $P_{pert}(x,t)$ is the polarization perturbation that leads into the coupling. By use of the index of refraction in the guide and the fields propagating in the two guides, Equation 29 can be rewritten as:

$$K_{12} = K_{21} = \frac{\omega}{4} \int_{-\infty}^{\infty} \epsilon_{1y}^*(x)\epsilon_o(N_c^2 - N_g^2)\epsilon_{2y}(x)dx \qquad (30)$$

where $N_c$ and $N_g$ are the effective indices of the guide as defined previously.

Using the field expressions of Equations 24 through 26 and the value for the constant A in Equation 28, the integration of Equation 30 is preferred. In the field expressions for the second guide, it should be noted that the expressions are shifted by w+s, where w is the guide width and s is the interguide center-to-center separation. The result of integration is:

$$K_{12} = K_{21} = \left[\frac{2h_o^2 p_o}{\beta_o\left(\omega + \frac{2}{p_o}\right)(h_o^2 + p_o^2)}\right] e^{-p_o s} \qquad (31)$$

Notice that this result has been particularized to the fundamental, symmetric lateral mode (the subscript o is an indication of this fact). The physical meaning of this equation is intuitively obvious. It says that the coupling between the laser guides increases exponentially as the guides are brought closer to one another.

Although evanescently coupled lasers have been studied extensively, it has not been possible to consistently achieve phase-locked operation. In the majority of the case reported in the literature [D. R. Scifres, W. Streifer and R. Burnham, *IEEE J. Quant. Electron.*, QE-15, 917 (1979; E. Kapon, Z. Rav-Noy, T. Lu, M. Yi, S. Margalit and A. Yariv, *Appl. Phys. Lett.*, 45, 1159 (1984)], the arrays have tended to operate in a mode that leads to a double-lobed far-field intensity pattern. It is speculated [D. E. Ackley and R. W. H. Engelman, *Appl. Phys. Lett.*, 39, 27 (1981); D. R. Scifres, R. D. Burnham and W. Streifer, *Appl. Phys. Lett.* 41, 118 (1982); J. P. van der Ziel, R. Mikulyak, H. Temkin, R. Logan and R. D. Dupuis, *IEEE J. Quant. Electron.*; QE-20, 1259 (1984)] that this mode of operation is favored whenever adjacent lasers in the array maintain a phase difference between them of $\pi$ radians. This phase difference has been attributed to loss between the active elements of the array [D. Boetz and J. C. Conolly, 41st Annual Device Research Conf., Univ. Vermont, Vt., Paper IVB-1, June 20-22 (1983); Y. Twu, A. Diens, S. Wang, J. R. Whinnery, *Appl. Phys. Lett.*, 45, 709 (1984); D. F. Welch, D. Scifres, P. Cross and H. Kung, *Appl. Phys. Lett.*, 47, 1134 (1985)]. Heretofore, there did not seem to be a method to correct this phase difference in the parallel-element geometry.

In accordance with the present invention, the usual parallel-element array guides are retained, but a section in the middle of the device is provided where the modes are unguided. This middle section forms the mode-mixing region. It allows the eigen-modes from each individual guide to mix because of diffraction, thus promoting phase-locking. If indeed there is a loss between the guides, the presence of this uniformly pumped region will also minimize this loss. This is illustrated in the schematic of the $M^2PL$ laser array shown in FIG. 1.

Having the mode-mixing region in the middle of the device means that it can be predetermined and defined accurately by photolithography. This length is then guaranteed not to change during all the subsequent device processing steps. If desired, the laser can also be designed to retain the evanescent wave coupling property of the previous laser structures. This, however, is not absolutely necessary, as sufficient coupling can be attained by use of the mode-mixing region.

In the previous description, it was assumed that the ridge waveguides that form the laser arrays were passive. This assumption allowed calculation of the important parameters of the waveguides without the complication of the gain and loss processes that are intrinsic to the operation of a laser. In the following description, the assumption is modified to include gain and loss.

It has been demonstrated experimentally [D. D. Cook and F. R. Nash, *Journ. Appl. Phys.*, 46, 1660 (1975)] that for a well-behaved lasing mode, where the lateral extent of the mode is determined by a stripe width, the near- and far-field scans of the lowest order mode is Gaussian in form. The Gaussian modal distribution of the emitted radiation is a result of the complex photon-carrier interactions in the cavity. These interactions manifest themselves macroscopically as gain and loss. Given these facts, it is reasonable to assume that the individual guided modes in the ridge waveguides used are Gaussian. Furthermore, each guide can be chosen such that it supports only the fundamental mode.

Having assumed that the allowed mode structure in each guide is Gaussian, the paraxial scalar wave equation describing the propagation characteristics of the mode can be written as:

$$\nabla^2 u + k^2 u = 0 \qquad (32)$$

where u is a field component and $k = 2\pi n_{eff}/\lambda_o$ is the propagation constant in the medium; $n_{eff}$ is the effective index of refraction. For light propagating in the z-direction, let:

$$u(x,y,z) = \epsilon(x,y,z) \exp(-jkz) \qquad (33)$$

where $\epsilon(x,y,z)$ is a slowly varying complex function that represents the non-uniform field intensity distribution, the beam expansion as a function of propagation distance and also phase front curvature. Substitution of Equation 33 into Equation 32 results in:

$$\frac{\partial^2 \epsilon}{\partial x^2} + \frac{\partial^2 \epsilon}{\partial y^2} - 2jk \frac{\partial \epsilon}{\partial z} = 0 \qquad (34)$$

where the function $\epsilon(x,y,z)$ is assumed to have a slow variation with z and therefore the second derivative of $\epsilon(x,y,z)$ is regulated with respect to z in comparison to the other terms. Equation 34 has the form of the time-dependent Schrodinger equation in two dimensions, where z plays the role of time. The solution to this equation has the form:

$$\epsilon(x,y,z) = \exp\left\{-j\left[P(z) + \frac{k}{2q(z)} r^2\right]\right\} \qquad (35)$$

where $r^2 = x^2 + y^2$. The parameter P(z) is complex and represents the phase shift associated with the propagation of the light. The term q(z) is also complex and describes the Gaussian variation of the mode intensity with distance r from the optic axis. Substituting Equation 35 into Equation 34, we obtain:

$$-\left(\frac{k}{q}\right)^2 r^2 - 2j\left(\frac{k}{q}\right) - k^2 r^2 \left(\frac{1}{q}\right)' - 2kP' = 0 \quad (36)$$

where the prime denotes differentiation with respect to z. Equation 36 is true when the different coefficients of all powers of r equal to zero so that:

$$(1/q)^2 + (1/q)' = 0 \quad (37)$$

$$P' = -j/q \quad (38)$$

It can be shown that Equation 37 integrates to:

$$q(z) = j\frac{\pi w_o^2 n_{eff}}{\lambda_o} + z \quad (39)$$

An imaginary constant of integration, $q_o = (j\pi w_o^2 n_{eff}/\lambda_o)$, is included in this result. The choice of this constant leads to physically meaningful waves whose energy is closely confined to the z-axis.

Inserting this result into Equation 38 and performing the required integration yields the complex phase parameter:

$$P(z) = j\ln\sqrt{1 + (z\lambda_o/\pi w_o^2 n_{eff})^2} - \tan^{-1}(\lambda_o z/\pi w_o^2 n_{eff}). \quad (40)$$

The constant of integration has been conveniently chosen to be zero. The only consequence of doing this is a shift in the time origin of the field solutions. Substituting the expressions of Equation 39 and Equation 40 into Equation 33 via Equation 35, we obtain the desired functional dependence of the fundamental Gaussian beam shape in the guide:

$$u(x,y,z) = \frac{w_o}{w(z)} \exp\left\{-j(kz - \phi(z)) - (x^2 + y^2)\left(\frac{1}{w^2(z)} + \frac{jk}{2R(z)}\right)\right\} \quad (41)$$

With the following parameter definitions: the dimension $2w_o$ is the minimum diameter of the Gaussian beam, called the beam waist. For ideal conditions, assume that this parameter is on the order of the guide width.

$$w(z) = w_o^2\left[1 + \left(\frac{z\lambda_o}{\pi w_o^2 n_{eff}}\right)^2\right] \quad (42)$$

$$R(z) = z\left[1 + \left(\frac{\pi w_o^2 n_{eff}}{\lambda_o z}\right)^2\right] \quad (43)$$

$$\phi(z) = \tan^{-1}\left(\frac{\lambda_o z}{\pi w_o^2 n_{eff}}\right) \quad (44)$$

The parameter w(z) gives the expansion of the beam diameter as a function of z in the medium without waveguides; R(z) is the radius of curvature of the Gaussian wavefront at z. The angle by which the beam spreads from the optic axis is given by $\phi(z)$.

Figure 8:
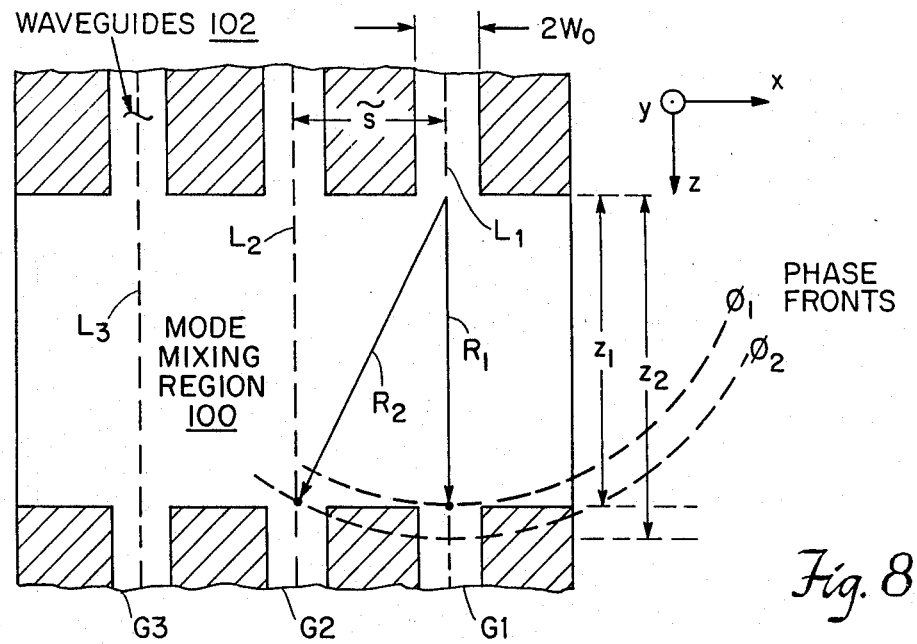
FIG. 8 is an illustration of the diffraction-coupling system of the invention.

Next, consider the illustration depicted on FIG. 8. The figure shows, schematically, three parallel guided laser beams L1, L2, L3, with a mode-mixing region 100 at the center of the structure and a first set of guide regions G1, G2, G3. The guided modes of the structure, when they reach the mode-mixing region 100 will spread in a manner described by Equation 41. This spreading, depending on the length $z_1$ of the mode-mixing region, will couple a fraction of the radiation guided in guide G2 to guide G1, and vice versa. In order for radiation from one guide to couple coherently to its nearest neighbor, the phase difference between the phase fronts of the modes emanating from the two guides in question, must be an integral multiple m of $2\pi$.

$$m = \frac{1}{2\pi}\tan^{-1}\left[\frac{2\pi n_{eff} a}{b\lambda_o}\right] - \quad (45)$$

$$\left\{\frac{n_{eff}}{\lambda_o}[\sqrt{z_1^2 + s^2} - z_1] + \frac{1}{2\pi}\tan^{-1}\left[\frac{\lambda_o z_1}{\pi w_o^2 n_{eff}}\right] - \frac{1}{2\pi}\tan^{-1}\left[\frac{\lambda_o \sqrt{z_1^2 + s^2}}{\pi w_o^2 n_{eff}}\right]\right\}$$

where:

$$a = \frac{1}{R_1(z_1)} - \frac{1}{R_2(z_2)} \quad (46)$$

and $$b = \frac{1}{\omega_1^2(Z_1)} + \frac{1}{\omega_2^2(Z_2)} \quad (47)$$

Figure 9:
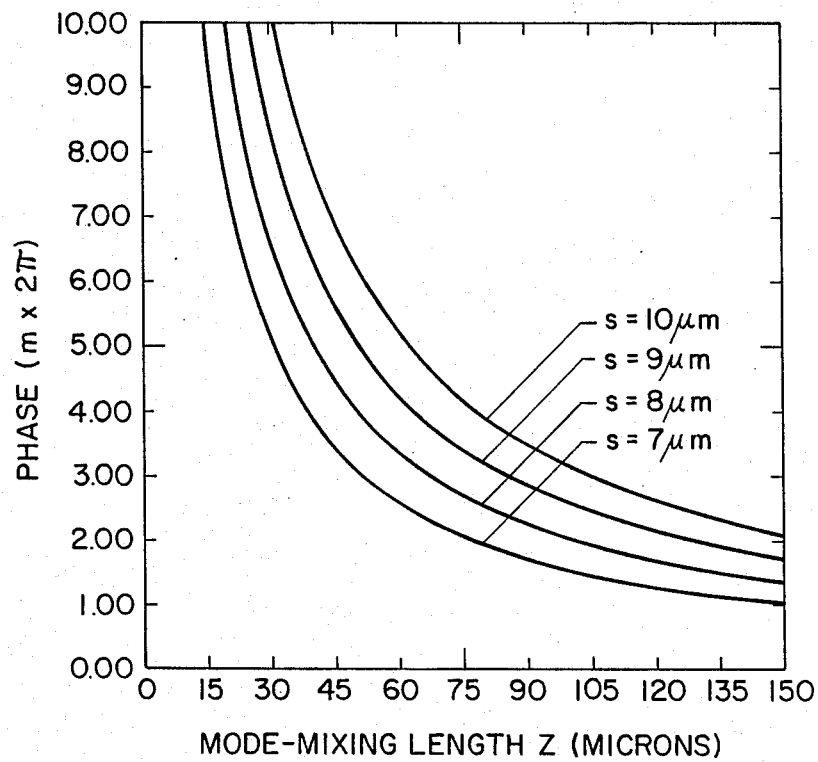
FIG. 9 is a plot of phase (2 $\pi$m) versus the length in microns of the mode-mixing region.

By solving Equation 45 graphically, one can determine the correct length of the mode-mixing region for collective coherence in order to achieve phase-locking. Note that the inter-guide center-to-center separation, $\bar{s}$, appears as a parameter in this equation and it can be set to any reasonable value. FIG. 9 depicts a graphical solution of this equation for several values of the inter-guide separation, $\bar{s}$. Given this value, the right length, $z_1$, for the mode-mixing region can be established by a quick reference to the figure.

Referring back to FIGS. 1 and 2, the details of the fabrication of the structure will now be described. The ridge waveguide structures 102 on the underlying structure is chemically etched with a photoresist acting as a mask. The chemical solution used for the etching is a mixture of $H_2SO_4:H_2O_2:H_2O$ (1:8:8) at room temperature. Its etching rate is determined for the particular (Al,Ga)As composition to be etched. Before etching, the wafer is rinsed in buffered HF and deionized water. This is crucial, because if the native oxide covering the wafer is not removed, the etching will proceed non-uniformly.

After etching through the cap layer 20 of p+-GaAs to the p-$Al_{0.5}Ga_{0.5}As$ cladding layer 18, the masking photoresist is removed by plasma-etching in oxygen plasma.

The p-type ohmic contact metallization 22 consists of titanium, platinum and gold. By use of these refractory metals Schottky barrier contacts can be made at the intermediate regions 104 where ohmic contacts are not desired.

The preparatory step before metallization is the removal of any oxides on the etched wafer surface by cleaning in buffered HF and rinsing in deionized water. After blow-drying in filtered nitrogen gas, the etched wafer is immediately loaded into an E-beam (electron beam) evaporator. The metals evaporated are: 400 Å of Ti, 200 Å of Pt and 3500 Å of Au. The first layer of Ti deposited adheres well to the semiconductor. It is used as an adhesive ("glue") for the other metals. It also forms a good Schottky barrier to the lightly-doped (Al,Ga)As layer 18 between the ridges. The Pt layer forms a diffusion barrier to prevent the Ti-Au reaction from occurring. The combination of the three metals, together, forms a good ohmic contact to the heavily-doped GaAs cap layer 20. The thicknesses deposited represent a compromise between the ease with which the wafer can be cleaved into individual laser devices and the degree of difficulty in bonding a gold wire to the top Au metal.

The metallization 22 on the p-type side of the laser structure performs the dual roles of facilitating the easy flow of current through the ridge waveguides and minimizing its flow between the guides.

Between the ridges is exposed a large band gap, low-doped, p-type (Al,Ga)As layer 18. Because of the large band gap, the semiconductor work function $\phi_3$, is larger than the Ti metal work function, $\phi_m$.

Depending on the polarity of the applied voltage, the metal-semiconductor contact 22/18 acts as a diode (rectifier) allowing hole current to flow readily in only one direction and not in the other. The barrier to the flow of any holes from the metal to the semiconductor can be made as large as desired by varying the band gap of the (Al,Ga)As layer. Thus, for a positive voltage applied to the metal contact (as in the case of a forward biased laser diode), the metal-semiconductor contact at the Ti-(Al,Ga)As surface acts as a reverse-biased diode.

The n-contact metallization 22 may be provided by thermal evaporation. The wafer is lapped down from the backside to a thickness of about 4 mils ($\sim 100$ μm). This step is necessary so that it is easy to cleave the wafer into individual discrete devices later. The lapping is performed on a lapping jig with $Al_3O_2$ (aluminum oxide) grit of varying sizes.

The wafer is cleaned in deionized water, etched in a bromo-methanol solution slightly, rinsed in methanol and iso-propyl alcohol and loaded into the evaporator immediately. After a pump-down to base pressures, the following metals are deposited: first, 800 Å of Au-Ge, then 120 Å of Ni and, finally, 1800 Å of Au. The Au-Ge increases the conductivity of the substrate; the Ni acts as an adhesive and the three layers, together, form a good n-type ohmic contact to the substrate 10.

Before further processing, the wafer is sintered to improve the ohmic contacts. The sintering is done in a furnace with a forming gas atmosphere, where the wafer can be placed with the n-side down on a carbon strip heater. The sample is sintered for 30-40 seconds at 400° C.

EQUIVALENTS

This completes the description of the preferred embodiment of the invention. Many alternatives and modifications thereof will become apparent to those skilled in the art. For example, other light emitting materials, such as InGaAsP, GaAlP, GaAlSb and PbSnTe. Other means beside ridge waveguides may be used for lateral mode confinement. More than one mixing region may be formed along each device and the spacing between cavities need not be equal. Accordingly, such equivalents are intended to be encompassed with the scope of the following claims.

We claim:

1. A laser device comprising:
   a plurality of cavities for emitting beams of coherent light formed in a monolithic structure;
   such cavities being arranged in parallel adjacent longitudinally extending waveguide structures; each such structure having transverse electromagnetic mode confinement means and lateral electromagnetic mode confinement means; and a mode mixing region intermediate the longitudinal ends of said cavities wherein said lateral mode confinement means is interrupted for a distance z sufficient to couple by diffraction a fraction of light propagating in one cavity to its next adjacent cavity and vice versa and wherein z is a distance in the range of 20 to 150 microns and which produces a $2\pi m$ phase difference between the phase fronts of the beams propagating in each cavity and wherein m is an integral multiple number of wavelengths of the propagating light.

2. The device of claim 1 wherein the transverse mode confinement means comprises hetero-epitaxial layers above and below the cavities and the lateral mode confinement means comprises ridge waveguides formed of regions of material of index of refraction $n_c$ over said regions with regions of index of refraction $n_o$ between said cavities and wherein $n_c$ is greater than $n_o$.

3. The device of claim 1 wherein:

$$m = \frac{1}{2\pi} \tan^{-1}\left[\frac{2\pi n_{eff} a}{b\lambda_o}\right] - \left\{ \frac{n_{eff}}{\lambda_o}[\sqrt{z_1^2 + s^2} - z_1] + \frac{1}{2\pi} \tan^{-1}\left[\frac{\lambda_o z_1}{\pi \omega_o^2 n_{eff}}\right] - \frac{1}{2\pi} \tan^{-1}\left[\frac{\lambda_o \sqrt{z_1^2 + s^2}}{\pi \omega_o^2 n_{eff}}\right] \right\}$$

where:

$$a = \frac{1}{R_1(z_1)} - \frac{1}{R_2(z_2)}$$

and $$b = \frac{1}{\omega_1^2(Z_1)} + \frac{1}{\omega_2^2(Z_2)}$$

and $n_{eff}$ is the effective index of refraction in a cavity,
$\lambda_o$ is the free space wavelength of the light beam propagating in a cavity,
$Z_1$ is the length of the mode mixing region,
$Z_2$ is equal to $R_2$ and $R_2$ is the radius of phase curvature of the light beam coupled to an adjacent cavity from a first cavity,
$\bar{s}$ is the center-to-center spacing between laterally adjacent guides,
$\omega_o$ is the light beam radius at the entrance to the mode mixing region,
$R_1$ is the radius of phase curvature of the light beam wavefront of a first cavity,
$\omega_1$ is the beam radius at the beginning of the mode mixing region of a first cavity,
$\omega_2$ is the beam radius at the beginning of the mode mixing region of an adjacent cavity.

4. The device of claim 3 wherein s is in the range of 7 to 10 microns.

5. A laser device comprising:
a plurality of cavities for emitting beams of coherent light formed in a monolithic structure;
such cavities being arranged in parallel adjacent longitudinally extending waveguide structures; each such structure having transverse electromagnetic mode confinement means provided by hetero-epitaxial layers above and below the cavities and lateral electromagnetic mode confinement means provided by ridge waveguides formed of regions of material of index of refraction $n_c$ over said cavities with regions of index of refraction $n_o$ between said cavities; wherein $n_c > n_o$; and a mode mixing region intermediate the longitudinal ends of said cavities wherein said lateral mode confinement means is interrupted for a distance z, in the range of 20 to 150 microns and sufficient to couple by diffraction a fraction of light propagating in one cavity to its next adjacent cavity and vice versa and wherein z is a distance which produces an optical path difference between coupled cavities of an integral number of wavelengths of the light beam.

6. The device of claim 5 wherein the hetero-epitaxial transverse electromagnetic mode confinement layers comprise AlGaAs layers.

7. The device of claim 6 wherein the ridge waveguides comprise parabolically graded AlGaAs layers.

8. The device of claim 7 including a cladding layer of p-type AlGaAs formed over said transverse electromagnetic mode confinement layers.

9. The device of claim 7 including a cap of p+ GaAs formed over said cavities.

10. The device of claim 9 including p-type ohmic contact metallization formed on said cap and said cladding layer such that Schottky barrier contacts are formed at the interface between the metallization and the cladding layer.

11. The device of claim 10 wherein the metallization comprises layers of titanium, platinum and gold.

12. A method of forming a laser device wherein beams of light are transmitted in a transverse electromagnetic mode and a lateral electromagnetic mode of propagation comprising:
(a) forming a plurality of cavities for emitting beams of coherent light formed in a monolithic structure, such cavities extending a longitudinal distance between two ends of the cavities;
(b) confining the transverse electromagnetic mode of propagation of the beams;
(c) confining the lateral electromagnetic mode of propagation of the beams;
(d) interrupting the lateral confinement of each beam in a region located centrally between two ends for a distance z, in the range of 20 to 150 microns and sufficient to couple by diffraction a fraction of light propagating in one guide to its next adjacent guide and vice versa; which distance produces an optical path difference between coupled guides; which difference s an integral number of wavelengths of the light beam.

13. The method of claim 12 wherein the integral number is m and:

$$m = \frac{1}{2\pi} \tan^{-1}\left[\frac{2\pi n_{eff} a}{b \lambda_o}\right] - \left\{ \frac{n_{eff}}{\lambda_o}[\sqrt{z_1^2 + s^2} - z_1] + \right.$$

-continued $$\left. \frac{1}{2\pi} \tan^{-1}\left[\frac{\lambda_o z_1}{\pi \omega_o^2 n_{eff}}\right] - \frac{1}{2\pi} \tan^{-1}\left[\frac{\lambda_o \sqrt{z_1^2 + s^2}}{\pi \omega_o^2 n_{eff}}\right] \right\}$$

where:

$$a = \frac{1}{R_1(z_1)} - \frac{1}{R_2(z_2)}$$

and $$b = \frac{1}{\omega_1^2(Z_1)} + \frac{1}{\omega_2^2(Z_2)}$$

and $n_{eff}$ is the effective index of refraction in a medium,
$\lambda_o$ is the free space wavelength of the light beam,
$z_1$ is the length of the mode mixing region,
$z_2$ is equal to $R_2$ and $R_2$ is the radius of phase curvature of the light beam coupled to an adjacent guide from a first guide,
$\bar{s}$ is the center-to-center spacing between laterally adjacent guides,
$\omega_o$ is the light beam radius at the entrance to the mode mixing region,
$R_1$ is the radius of phase curvature of the light beam wavefront of a first cavity,
$\omega_1$ is the beam radius at the beginning of the mode mixing region of a first cavity,
$\omega_2$ is the beam radius at the beginning of the mode mixing region of an adjacent cavity.

14. The method of claim 13 s is in the range of 7 to 10 microns.

15. A method of forming a laser device comprising the steps of:
forming a plurality of guided regions for emitting beams of coherent light in a monolithic structure, such cavities being arranged in parallel adjacent longitudinally extending waveguide structures; each such structure having transverse electromagnetic mode confinement means provided by hetero-epitaxial layers above and below the guided regions and lateral electromagnetic mode confinement means provided by ridge waveguides formed of regions of material of index of refraction $n_c$ over said guided regions with regions of index of refraction $n_o$ between said guided regions; wherein $n_c > n_o$; and forming a mode mixing region intermediate the longitudinal ends of said guided regions wherein said lateral mode confinement means is interrupted for a distance z, in the range of 20 to 150 microns and sufficient to couple by diffraction a fraction of light propagating in one guided region to its next adjacent guided region and vice versa and wherein z is a distance which produces an optical path difference between coupled guided regions of an integral number of wavelengths of the light beam.

16. The method of claim 15 wherein the hetero-epitaxial transverse electromagnetic mode confinement layers comprise AlGaAs layers.

17. The method of claim 16 wherein the ridge waveguides comprise parabolically graded AlGaAs layers.

18. The method of claim 17 wherein forming a cladding layer of p-type AlGaAs over said transverse electromagnetic mode confinement layers.

19. The method of claim 17 including forming a cap of p+ GaAs over said cavities.

20. The method of claim 19 including forming a p-type ohmic metallization contact on said cap and said cladding layer such that Schottky barrier contacts are formed at the interface between the metallization and the cladding layer.

21. The method of claim 20 wherein the metallization comprises layers of titanium, platinum and gold.

* * * * *

UNITED STATES PATENT AND TRADEMARK OFFICE
CERTIFICATE OF CORRECTION

PATENT NO. : 4,827,482
DATED : May 2, 1989
INVENTOR(S) : Elias Towe et al

Page 1 of 2

It is certified that error appears in the above-identified patent and that said Letters Patent is hereby corrected as shown below:

Column 14, lines 32 and 33, should read $$-\mathbf{m} - \frac{1}{2\pi} \tan^{-1} \left[ \frac{2\pi n_{eff} a}{b \lambda o} \right] - \left\{ \frac{n_{eff}}{\lambda o} \left[ \sqrt{z_1^2 + \bar{s}^2} - z_1 \right] + -\right.$$

Column 14, lines 36 and 37, should read $$- \frac{1}{2\pi} \tan^{-1} \left[ \frac{\lambda o z_1}{\pi \omega_o^2 n_{eff}} \right] - \frac{1}{2\pi} \tan^{-1} \left[ \frac{\lambda o \sqrt{z_1^2 + \bar{s}^2}}{\pi \omega_o^2 n_{eff}} \right] \right\}$$

Column 15, lines 66 and 67, should read $$-\mathbf{m} - \frac{1}{2\pi} \tan^{-1} \left[ \frac{2\pi n_{eff} a}{b \lambda o} \right] - \left\{ \frac{n_{eff}}{\lambda o} \left[ \sqrt{z_1^2 + s^2} - z_1 \right] + -\right.$$

Column 16, lines 4 and 5, should read $$- \frac{1}{2\pi} \tan^{-1} \left[ \frac{\lambda_o z_1}{\pi \omega_o^2 n_{eff}} \right] - \frac{1}{2\pi} \tan^{-1} \left[ \frac{\lambda_o \sqrt{z_1^2 + \bar{s}^2}}{\pi \omega_o^2 n_{eff}} \right]$$

UNITED STATES PATENT AND TRADEMARK OFFICE
CERTIFICATE OF CORRECTION

PATENT NO. : 4,827,482

DATED : May 2, 1989

INVENTOR(S) : Elias Towe et al

It is certified that error appears in the above-identified patent and that said Letters Patent is hereby corrected as shown below:

Column 15, line 59, delete "s" and insert --is--.

Column 16, line 66, delete "wherein" and insert --including--.

Signed and Sealed this

Twenty-fourth Day of October, 1989

Attest:

DONALD J. QUIGG

*Attesting Officer*    *Commissioner of Patents and Trademarks*

UNITED STATES PATENT AND TRADEMARK OFFICE
CERTIFICATE OF CORRECTION

PATENT NO. : 4,827,482
DATED : May 2, 1989
INVENTOR(S) : Elias Towe and Clifton G. Fonstad, Jr.

It is certified that error appears in the above—identified patent and that said Letters Patent is hereby corrected as shown below:

Col. 14, delete lines 46 and 47 and insert:

$$\ldots b = \frac{1}{\omega_1^2(z_1)} + \frac{1}{\omega_2^2(z_2)} \ldots$$

Col. 14, line 53, delete "$Z_1$" and insert $\ldots z_1 \ldots$.

Col. 14, line 54, delete "$Z_2$" and insert $\ldots z_2 \ldots$.

Col. 16, delete lines 13 and 14 and insert:

$$\ldots b = \frac{1}{\omega_1^2(z_1)} + \frac{1}{\omega_2^2(z_2)} \ldots$$

Signed and Sealed this

Fifth Day of December, 1989

*Attest:*

JEFFREY M. SAMUELS

*Attesting Officer*   Acting Commissioner of Patents and Trademarks